(12) United States Patent
Lee et al.

(10) Patent No.: US 7,684,204 B2
(45) Date of Patent: Mar. 23, 2010

(54) CIRCUIT BOARD FOR MOUNTING MULTILAYER CHIP CAPACITOR AND CIRCUIT BOARD APPARATUS INCLUDING THE MULTILAYER CHIP CAPACITOR

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 88 days.

(21) Appl. No.: 12/155,583

(22) Filed: Jun. 6, 2008

(65) Prior Publication Data
US 2009/0073634 A1    Mar. 19, 2009

(30) Foreign Application Priority Data
Sep. 19, 2007    (KR) .................... 10-2007-0095522

(51) Int. Cl.
*H05K 7/00*    (2006.01)
(52) U.S. Cl. ................. 361/760; 361/734; 361/763; 361/767; 361/768; 361/782; 361/299.3; 361/301.1; 361/306.3
(58) Field of Classification Search ................. 361/760, 361/761, 734, 738, 763, 767, 768, 782, 808, 361/811, 821, 303, 299.3, 301.1, 306.3; 174/260, 174/261, 262
See application file for complete search history.

(56) References Cited
U.S. PATENT DOCUMENTS

| | | | |
|---|---|---|---|
| 5,880,925 A | 3/1999 | DuPre et al. | |
| 6,577,490 B2 * | 6/2003 | Ogawa et al. | 361/306.1 |
| 6,781,816 B2 * | 8/2004 | Togashi | 361/306.3 |
| 7,054,134 B2 * | 5/2006 | Togashi et al. | 361/301.4 |
| 7,215,531 B2 * | 5/2007 | Naito et al. | 361/306.1 |
| 7,573,698 B2 * | 8/2009 | Eggerding et al. | 361/306.3 |
| 2004/0022038 A1 * | 2/2004 | Figueroa et al. | 361/763 |
| 2004/0184219 A1 * | 9/2004 | Otsuka et al. | 361/306.3 |
| 2005/0041367 A1 * | 2/2005 | Yoshii et al. | 361/303 |

* cited by examiner

*Primary Examiner*—Jinhee J Lee
*Assistant Examiner*—Hoa C Nguyen
(74) *Attorney, Agent, or Firm*—McDermott Will & Emery LLP

(57) ABSTRACT

A circuit board including: a substrate having a mounting area for mounting a vertical multilayer chip capacitor having first and second external electrodes of a first polarity and a third external electrode of a second polarity; first to third pads arranged on the mounting area, the first and second pads having the first polarity and disposed separately from each other on the mounting area, the third pad having the second polarity and disposed between the first and second pads to be connected to the third external electrode; at least one first via formed in the substrate and connected to the first pad; at least one second via formed in the substrate and connected to the second pad; and a plurality of third vias formed in the substrate and connected to the third pad. The first via is disposed adjacent to the third pad relative to a central line of the first pad, the second via is disposed adjacent to the third pad relative to a central line of the second pad, one or more of the third vias are disposed adjacent to the first via relative to a central line of the third pad, and the rest of the third vias are disposed adjacent to the second via relative to the central line of the third pad.

22 Claims, 15 Drawing Sheets

CIRCUIT BOARD FOR MOUNTING MULTILAYER CHIP CAPACITOR AND CIRCUIT BOARD APPARATUS INCLUDING THE MULTILAYER CHIP CAPACITOR

CROSS-REFERENCE TO RELATED APPLICATIONS

This application claims the priority of Korean Patent Application No. 2007-0095522 filed on Sep. 19, 2007, in the Korean Intellectual Property Office, the disclosure of which is incorporated herein by reference.

BACKGROUND OF THE INVENTION

1. Field of the Invention

The present invention relates to a circuit board for mounting a multilayer chip capacitor and a circuit board apparatus including the multilayer chip capacitor, and more particularly, to a circuit board for mounting a vertical multilayer chip capacitor, the circuit board having a capacitor-mounting structure useful for high frequency decoupling, and a circuit board apparatus including the circuit board and the vertical multilayer chip capacitor.

2. Description of the Related Art

A multilayer chip capacitor is used as a decoupling capacitor arranged in a high frequency circuit such as a power supply circuit of CPU or other LSI. To stabilize a power supply circuit, the multilayer chip capacitor is required to have a low equivalent series inductance (ESL). This requirement is further increased as electronic devices tend to be operated at high frequency and high current. A multilayer chip capacitor is also used as an electromagnetic interference (EMI) filter. In this case, a low ESL is preferable for a high frequency noise removal effect and a good attenuation property.

A decoupling capacitor can be electrically connected to a mounting pad on a package circuit board by soldering. The mounting pad may be connected to another external circuit through conductive patterns or conductive vias in the board. Depending on a mounting structure of a capacitor, a loop inductance including the capacitor may become different. Such a difference in loop inductance has an effect on an impedance of an entire power distribution network. To design a stable power distribution network, the loop inductance may be reduced as possible.

To reduce ESL, U.S. Pat. No. 5,880,925 discloses a multilayer capacitor in which leads of first and second internal electrodes having opposite polarities, are disposed in an inter-digitated arrangement. However, in order to implement more stable power distribution network or remove high frequency noise more effectively, it is necessary to further reduce ESL of a capacitor and/or a loop inductance caused by pads, wiring, vias or other conductive patterns.

SUMMARY OF THE INVENTION

An aspect of the present invention provides a circuit board for mounting a vertical multilayer capacitor, the circuit board capable of reducing a loop inductance.

Another aspect of the present invention provides a circuit board apparatus including a vertical multilayer chip capacitor, the apparatus having a mounting structure capable of reducing a loop inductance.

According to an aspect of the present invention, there is provided a circuit board including: a substrate having a mounting area for mounting a vertical multilayer chip capacitor having first and second external electrodes of a first polarity and a third external electrode of a second polarity; first to third pads arranged on the mounting area of the substrate, the first and second pads having the first polarity and disposed separately from each other on the mounting area to be connected to the first and second external electrodes, respectively, the third pad having the second polarity and disposed between the first and second pads to be connected to the third external electrode; at least one first via formed in the substrate and connected to the first pad; at least one second via formed in the substrate and connected to the second pad; and a plurality of third vias formed in the substrate and connected to the third pad, wherein the first via is disposed adjacent to the third pad relative to a central line of the first pad, the second via is disposed adjacent to the third pad relative to a central line of the second pad, one or more of the third vias are disposed adjacent to the first via relative to a central line of the third pad, and the rest of the third vias are disposed adjacent to the second via relative to the central line of the third pad.

One of the first via, one of the second via, and two of the third vias may be disposed in the circuit board. In this case, the first to third vias may be aligned in a direction identical to an arrangement direction of the first to third pads.

A plurality of the first vias and a plurality of the second vias may be disposed in the circuit board. Particularly, two of the first vias, two of the second vias and four of the third vias may be disposed in the circuit board.

The plurality of the first vias may form at least one first via column in a longitudinal direction of the first pad, the plurality of the second vias may form at least one second via column in a longitudinal direction of the second pad, and the plurality of the third vias may form a plurality of third via columns in a longitudinal direction of the third pad. Each of the first to third via columns includes two or more vias. One or more of the plurality of third via columns may be adjacent to the first via column and the rest of the plurality of third via columns may be adjacent to the second via column. Particularly, each of the via columns may include two vias.

According to another aspect of the present invention, there is provided a circuit board apparatus including: the circuit board described above; and a vertical multilayer chip capacitor mounted on the mounting area of the circuit board and having first to third external electrodes connected to the first to third pad, respectively. The first and second external electrodes have the first polarity, and the third external electrode has the second polarity.

The vertical multilayer chip capacitor may include: a capacitor body formed by laminating a plurality of dielectric layers, the capacitor body having first and second side surfaces facing each other and a bottom surface; and a plurality of first-polarity and second-polarity internal electrodes alternately disposed to face each other in the capacitor body, interposing the respective dielectric layers therebetween and disposed vertical to the bottom surface of the capacitor body, the first-polarity and second-polarity internal electrodes drawn to the bottom surface of the capacitor body. The first and second external electrodes are formed on the first and second side surfaces of the capacitor body, respectively, partially extended onto the bottom surface and electrically connected to the first-polarity internal electrodes. The third external electrode is formed on the bottom surface between the first and second external electrodes and electrically connected to the second-polarity internal electrodes. Two current loops are generated by currents flowing from the first and second external electrodes to the third external electrode.

Each of the first-polarity internal electrodes may be drawn to the bottom surface and at least one side surface of the first and second side surfaces of the capacitor body.

A width of the third external electrode may be greater than a width of a portion of the first external electrode extended onto the bottom surface, and a width of a portion of the second external electrode extended onto the bottom surface.

Each of the first-polarity internal electrodes may have a first internal electrode pattern connected to both the first and second external electrodes, and each of the second-polarity internal electrodes may have a second internal electrode pattern connected to the third external electrode.

The plurality of first-polarity internal electrodes may have a first internal electrode pattern connected to only the first external electrode and a second internal electrode pattern connected to only the second external electrode, the first and second internal electrode patterns alternately disposed in a lamination direction. Each of the second-polarity internal electrodes may have a third internal electrode pattern connected to the third external electrode.

The multilayer chip capacitor may further include a fourth external electrode of the second polarity formed on a top surface of the capacitor body between the first external electrode and the second external electrode. In this case, internal and external structures of the multilayer chip capacitor may have up-down symmetry.

In the capacitor having the fourth external electrode, each of the first-polarity internal electrodes may have an H-shaped electrode pattern to be connected to the first and second external electrodes, and each of the second-polarity internal electrodes may have a +-shaped electrode pattern to be connected to the third and fourth external electrodes.

In the capacitor having the fourth external electrode, the first polarity internal electrodes may have a first T-shaped electrode pattern connected to the first external electrode and a second T-shaped electrode pattern connected to the second external electrode. The first and second T-shaped electrode patterns may be alternately disposed in a lamination direction. Each of the second-polarity internal electrodes may have a +-shaped electrode pattern.

In this specification, "bottom surface" of the capacitor body is a surface which is to be mounted on the circuit board, and "top surface" of the capacitor body is a surface opposite to the bottom surface.

According to exemplary embodiments of the present invention, a loop inductance formed through a multilayer chip capacitor mounted on a circuit board can be reduced. Therefore, the impedance of the entire power distribution network can be further reduced, and the design of a more stable power distribution network can be easy.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
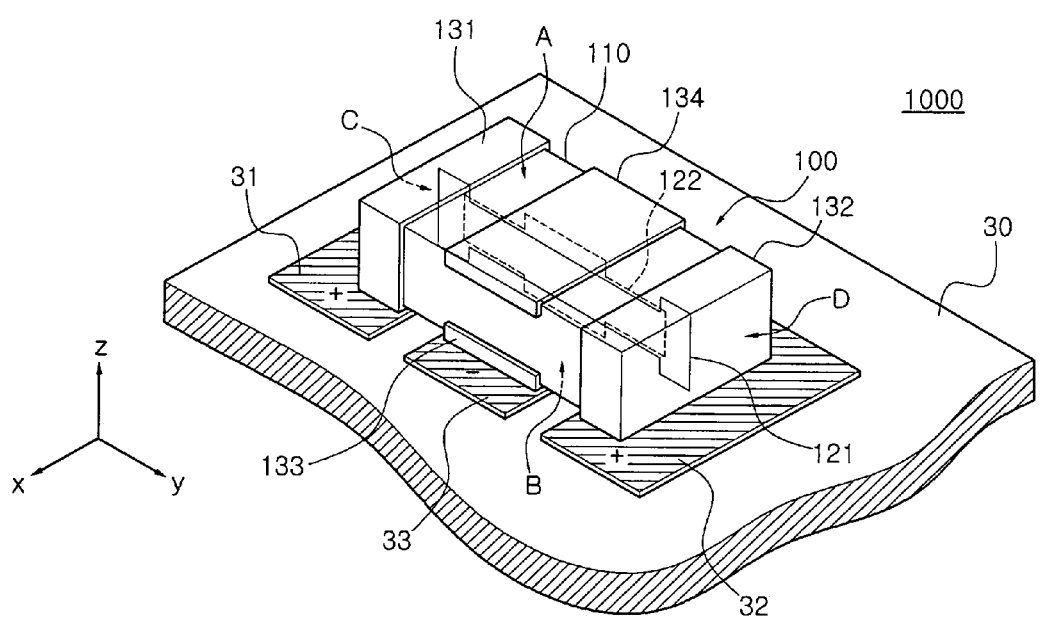
FIG. 1 is a perspective view illustrating a circuit board apparatus according to an embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

Figure 2:
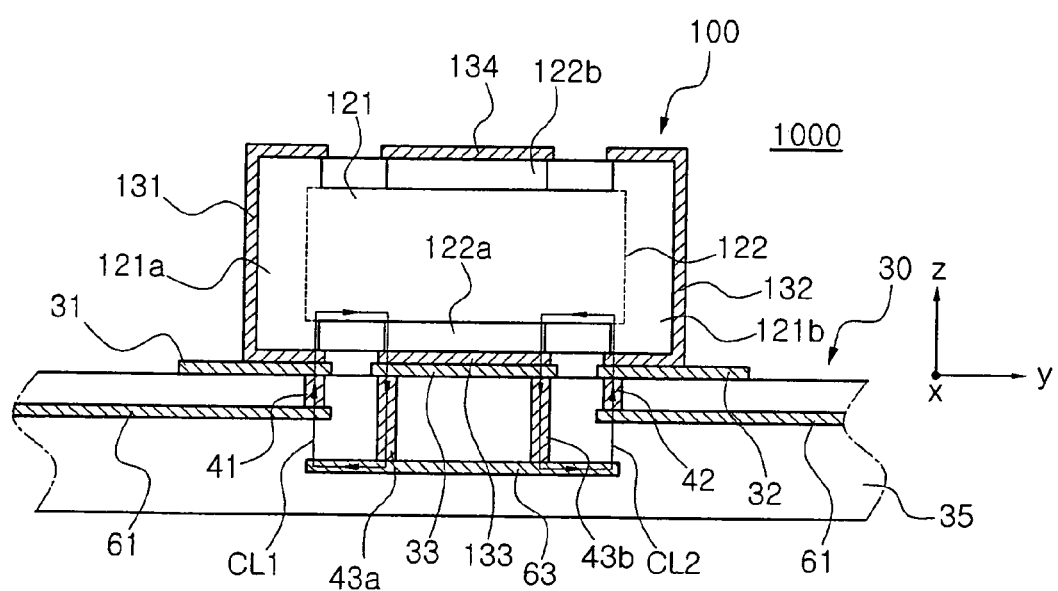
FIG. 2 is a cross-sectional view illustrating the circuit board apparatus of FIG. 1, cut along a line parallel to y axis.

FIG. 1 is a perspective view illustrating a circuit board apparatus 1000 according to an embodiment of the present invention, and FIG. 2 is a cross-sectional view illustrating the circuit board apparatus 1000. Referring to FIGS. 1 and 2, a 3-terminal vertical multilayer chip capacitor 100 is mounted on a circuit board 30. Herein, "vertical multilayer" indicates that internal electrodes in a capacitor are vertically disposed on a mounting area surface of a circuit board, and "3-terminal" indicates that totally three terminals are connected to a circuit board as a terminal of a capacitor.

As illustrated in FIGS. 1 and 2, the circuit board 30 includes a substrate 35, pads 31, 32, and 33 on the substrate 35, and conductive vias 41, 42, 43a, and 43b in the substrate 35. An area on the substrate 35 where the pads 31, 32, and 33 are formed is provided as a mounting area for a capacitor. First to third pads 31, 32, and 33 are arranged in y-axis direction on the mounting area of the substrate 35. The third pad 33 is disposed between the first pad 31 and second pad 32. The first and second pads 31 and 32 have the same polarity (e.g., positive polarity), and the third pad 33 has the opposite polarity (e.g., negative polarity). The pads 31, 32, and 33 are connected to the corresponding external electrodes 131, 132, and 133, respectively.

In the substrate 35, the vias 41, 42, 43a, and 43b connected to the pads 31, 32, and 33, respectively, are vertically extended. That is, a first via 41 is connected to the first pad 31, a second via 42 is connected to the second pad 32, and third vias 43a and 43b are connected to the third pad 33. The vias 41 and 42 of one polarity are connected to a first conductive pattern 61 such as a conductive plane at a bottom end thereof. The vias 43a and 43b of the other polarity are connected to a second conductive pattern 63 at a bottom end thereof. The first and second conductive patterns 61 and 63 may form, for example, power/ground planes.

As described later, the circuit board 30 together with the capacitor 100 mounted thereon forms a double current loop (refer to CL1 and CL2 shown in FIG. 2). To reduce a size or area of the current loop, the first and second vias 41 and 42 are disposed adjacent to the third pad 33, one via 43a of the third vias 43a and 43b is disposed adjacent to the first via 41, and the other via 43b of the third vias 43a and 43b is disposed adjacent to the second via 42.

Figure 3:
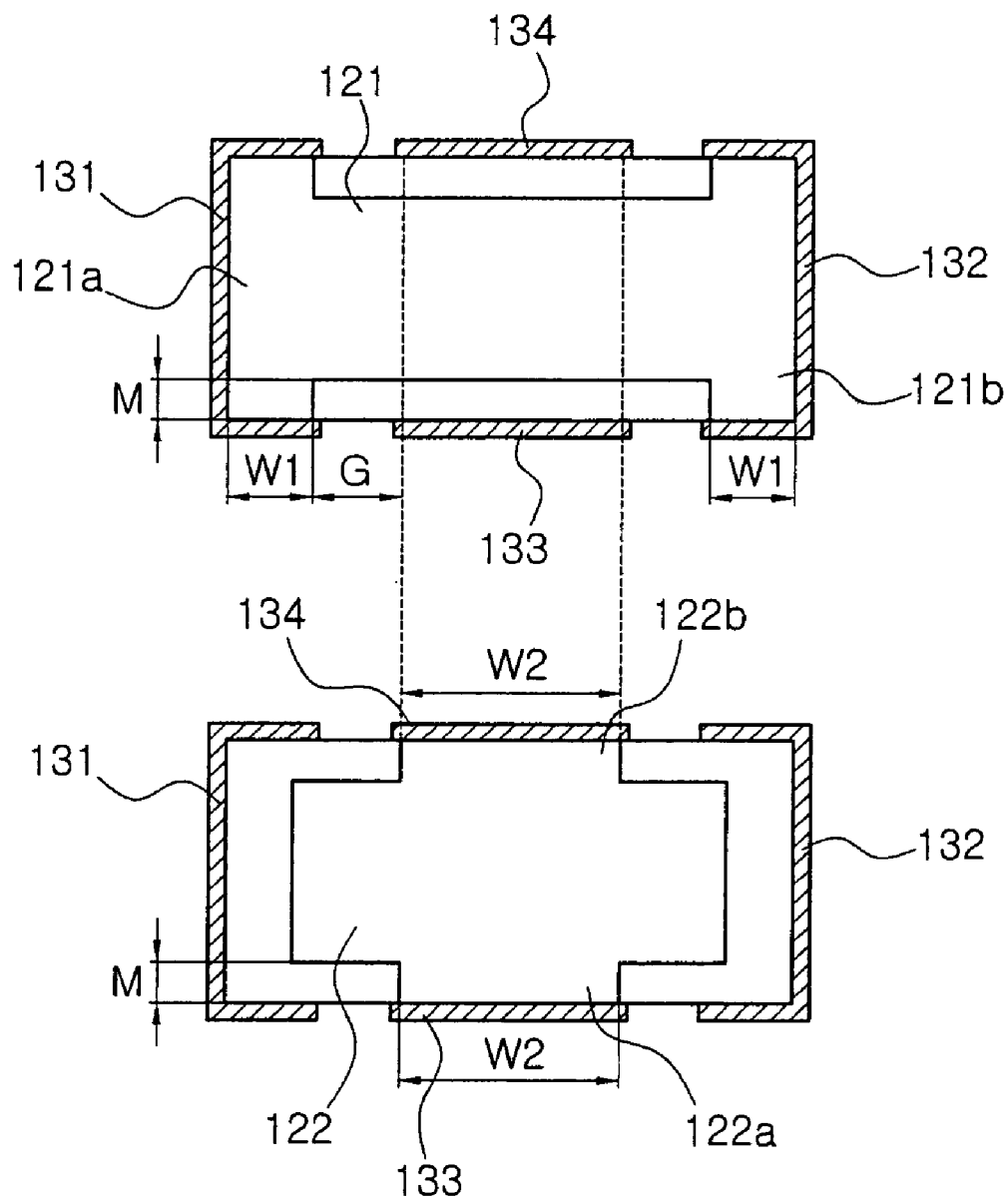
FIG. 3 is a cross-sectional view illustrating a structure of internal electrodes of a multilayer chip capacitor shown in FIG. 1.

FIG. 3 is a cross-sectional view illustrating a structure of internal electrodes of the capacitor 100 of FIG. 1. Referring to FIGS. 1 and 3, the capacitor 100 includes a capacitor body 110, and first to fourth external electrodes 131, 132, 133, and 134. The capacitor body 110 is formed by a lamination of a plurality of dielectric layers 110a and 110b. In the capacitor body 110, a first internal electrode 121 of a first polarity and a second internal electrode 122 of a second polarity are alternately disposed to face each other, with the respective dielectric layers interposed therebetween. The internal electrodes 121 and 122 are vertically disposed on a bottom surface B or the capacitor mounting area of the board 30.

The first and second external electrodes 131 and 132 of the same polarity are formed on a first and second side faces C and D of the capacitor body 110, partially extended onto the bottom surface B by a predetermined width, and electrically connected to the first internal electrode 121. As illustrated, the first and second external electrodes 131 and 132 may be extended to the top surface A of the capacitor body 110. The third external electrode 133 having a different polarity from that of the first external electrode 131 and having a predetermined width is formed on the bottom surface B between the first and second external electrodes 131 and 132 along the lamination direction (x-axis direction) and electrically connected to the second internal electrode 122. In addition, on the top surface A, the fourth external electrode 134 having the same polarity as that of the third external electrode 133 is disposed to be electrically connected to the second internal electrode 122.

Referring to FIG. 3, the first internal electrode 121 has an H-shaped conductive pattern and is connected to the first and second external electrodes 131 and 132 through first and second leads 121a and 121b. Particularly, the first lead 121a is drawn to the first side surface C, the top surface A and the bottom surface B of the capacitor body 110. The second lead 121b is drawn to the second side surface D, the top surface A and the bottom surface B. The second internal electrode 122 has a +-shaped conductive pattern and is connected to the third and fourth external electrodes 133 and 134 through the third and fourth leads 122a and 122b. Since the respective leads 121a and 121b of the first internal electrode 121 are in contact with the corresponding external electrodes 131 and 132 through wide contact areas of the side surfaces C or D, the bottom surface B, and the top surface A, current paths flowing through the respective leads 121a and 121b have wide widths, thereby reducing the ESL of the capacitor 100.

Referring to FIG. 3, a width $W_1$ of a portion of the first lead 121a drawn to the bottom surface B is identical to a width $W_1$ of a portion of the second lead 121b drawn to the bottom surface B of the second lead 121b. Particularly, it is preferable that the width $W_2$ of the third lead 122a is wider than the width $W_1$ of the portion of the first lead 121a drawn to the bottom surface B in terms of ESL reduction of the capacitor 100. This can be known from an empirical fact the ESL of the capacitor 100 is reduced as a ratio $W_2/W_1$ of lead widths is increased. Accordingly, it is preferable that the width of the third external electrode is wider than the width of the portion of the first external electrode 131 extended onto the bottom surface, and the width of the portion of the second external electrode 132 extended onto the bottom surface. Also, as a gap G between the first lead 121a and the third lead 122a and a distance M from a main portion of the internal electrode to the bottom surface are smaller, the ESL of the capacitor 100 is further reduced.

As illustrated, since the internal and external structures of the capacitor 100 are up-down symmetrical, the directionality of the capacitor 100 may be eliminated. Accordingly, when mounting the capacitor 100 on the circuit board 30, anyone of the top surface and the bottom surface of the capacitor 100 may be provided as a mounting surface. The capacitor 100 can be mounted without consideration of the direction of the mounting surface.

Figure 4:
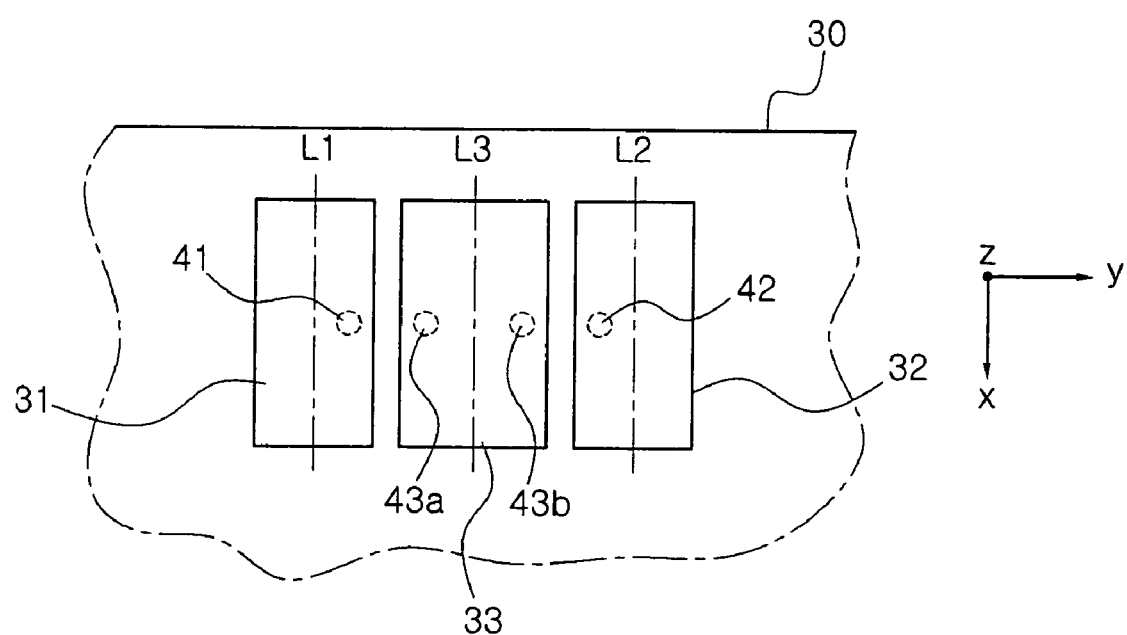
FIG. 4 is a top view illustrating the circuit board of FIG. 1.

FIG. 4 is a top view illustrating the circuit board 30. Referring to FIGS. 2 and 4, the first and second pads 31 and 32 of the circuit board 30 connected to the first and second external electrodes 131 and 132 are connected to the first via 41 and the second via 42 at bottoms thereof, respectively. The third pad 33 connected to the third external electrode 133 are connected to a plurality of third vias 43a and 43b. Particularly, the first via 41 is disposed in a region adjacent to the third pad 33 relative to a central line L1 of the first pad 31, and the second via 42 is disposed in a region adjacent to the third pad 33 relative to a central line L2 of the second pad 32. Also, one via 43a of the third vias 43a and 43b is disposed adjacent to the first via 41 relative to a central line L3 of the third pad 33, and the other via 43b of the third vias 43a and 43b is disposed adjacent to the second via 42 relative to the central line L3 of the third pad 33. In this case, the respective central lines L1, L2, and L3 are extended in the direction identical to the lamination direction (x-axis direction) of the internal electrodes in the mounted capacitor.

Positions of the respective vias 41, 42, 43a, and 43b are determined as described above, thereby reducing sizes or loop areas of two current loops CL1 and CL2 as shown in FIG. 2 and thus reducing loop inductance.

Describing in detail referring to FIG. 2, one CL1 of the two current loops CL1 and CL2 flows through the first via 41, the first pad 31, and the first external electrode 131 of a first polarity (e.g., positive polarity) and proceeds to the third external electrode 133 of a second polarity (e.g., negative polarity), the third pad 33, and the third via 43a adjacent to the first via 41, through the first and second internal electrodes 121 and 122. As described above, since the first via 41 is adjacent to the third pad 33 and the third via 43a is adjacent to the first via 41, the size of the current loop CL1 is reduced as shown in FIG. 2.

Similarly, the other current loop CL2 passes through the second via 42 of the first polarity, the second pad 32, and the second external electrode 132 and proceeds to the third external electrode 133 of the second polarity, the third pad 33, and the third via 43b adjacent to the second via 42 through the first and second internal electrodes 121 and 122. Since the second via 42 is adjacent to the third pad 33 and the third via 43b is adjacent to the second via 42, the size of the current loop CL2 is reduced as shown in FIG. 2. If the first polarity is negative and the second polarity is positive, proceeding directions of the current loops CL1 and CL2 are opposite to those mentioned above and the sizes of the current loops CL1 and CL2 are also reduced.

In FIG. 4, only one via 41 (the first via) connecting the first conductive pattern 61 and the first pad 31 is formed, and only one via 42 (the second via) connecting the first conductive pattern 61 and the second pad 32 is formed. Totally two vias 43a and 43b (the third vias) connecting the second conductive pattern 63 and the third pad 33 are formed. Particularly, the first to third vias 41, 42, 43a, and 43b are arranged in the arrangement direction (y-axis direction) of the first to third pads 31, 32, and 33 to form one row of vias.

However, the present invention is not limited thereto. A plurality of first vias and a plurality of second vias, and three or more third vias may be formed. The larger number of vias are formed in each pad area, the more loops connected in parallel are formed. It is advantageous to use a large number of vias as possible, in an aspect of reducing inductance. However, the larger number of vias, the more increased circuit board costs.

Figure 5:
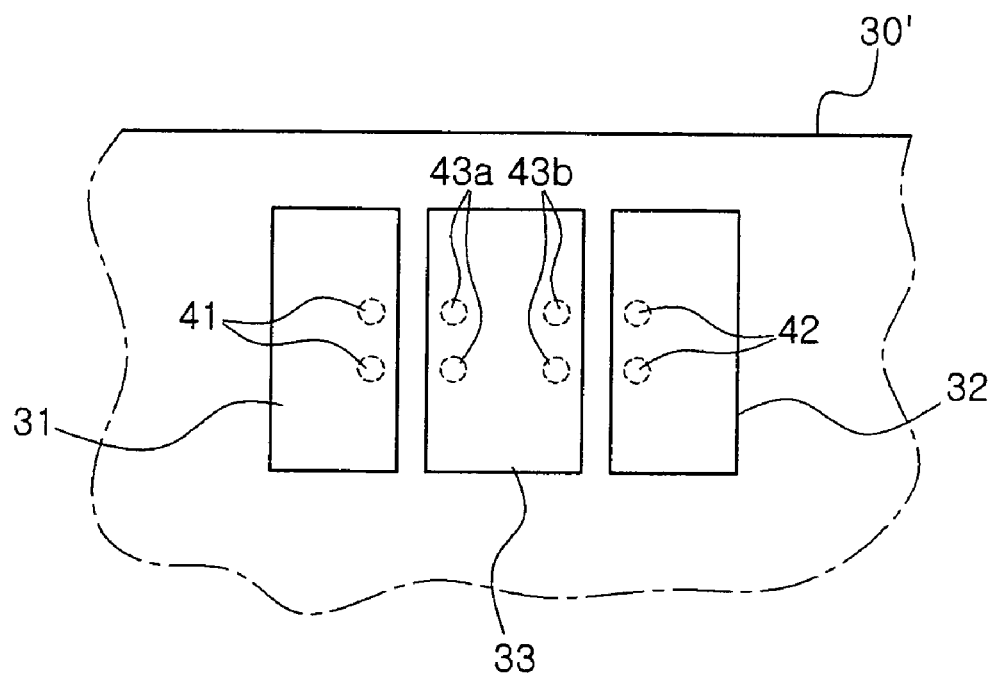
FIG. 5 is a top view illustrating a modified example of the circuit board of FIG. 4.
Figure 6:
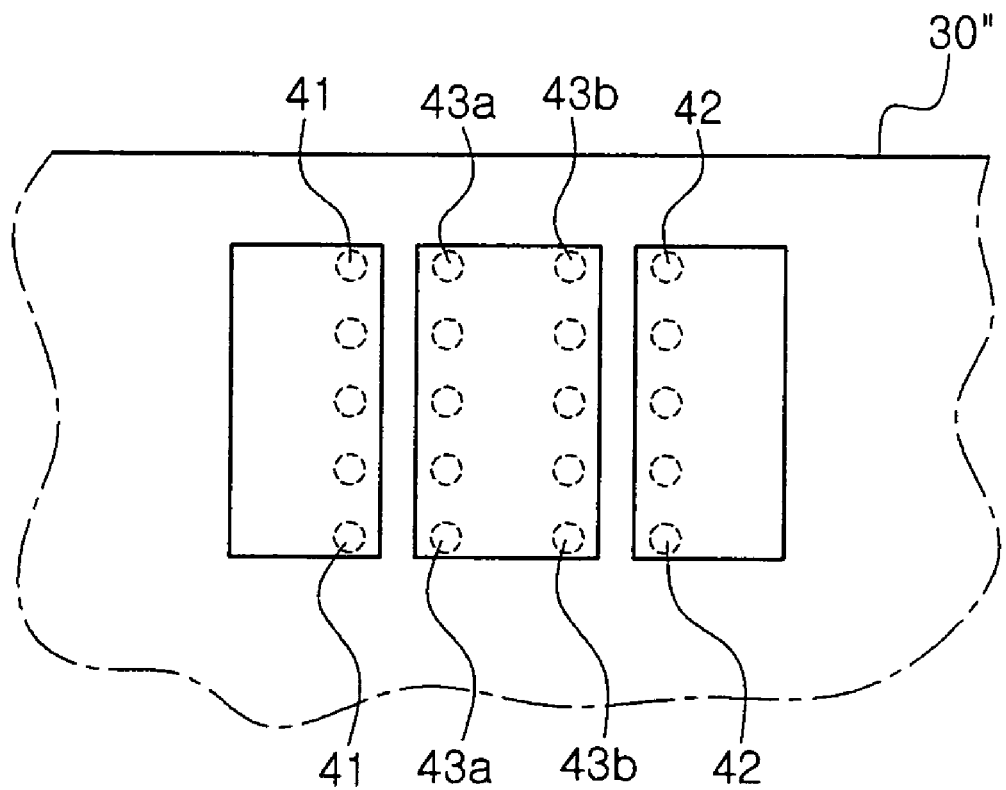
FIG. 6 is a top view illustrating another modified example of the circuit board of FIG. 4.

FIGS. 5 and 6 are top views illustrating various modified examples of the circuit board of FIG. 4, where it is shown that a plurality of conductive vias are formed in each pad. Referring to FIG. 5, in a circuit board 30', two of the first vias 41 are formed to be connected to the first pad 31, and two of the second vias 42 are formed to be connected the second pad 32. Totally four of the third vias 43a and 43b are formed to be connected to the third pad 33. In FIG. 5, position condition of the first to third via holes, which is described above, is satisfied. That is, the first vias 41 and the second vias 42 are disposed adjacent to the third pad 33, and the third vias 43a are adjacent to the first vias 41 and the third vias 43b are adjacent to the second vias 42. Two vias in each pad area form one via column.

Referring to FIG. 6, a circuit board 30" includes five of the first vias 41, five of the second vias 42, five of the third vias 43a, and five of the other third vias 43b while satisfying the described position condition of the first to third vias 41, 42, 43a, and 43b. The vias in each pad area are aligned in a longitudinal direction of each pad, that is the lamination direction of the internal electrodes (x-axis direction), to form a via column. In detail, the five first vias 41 are lined up in one direction (x-axis direction) to form a first via column, and the five second vias 42 are lined up in the same direction to form a second via column. The ten third vias 43a and 43b form two third via columns each extending in the same direction. In this case, one via column of the third vias 43a is adjacent to the first via column 41, and the other via column of the third vias 43b is adjacent to the second via column 42. Each via column may include two or more vias. Therefore, each via column may include 2 (as shown in FIG. 5), 3, 4, 5, 6 or more of vias.

Figure 7:
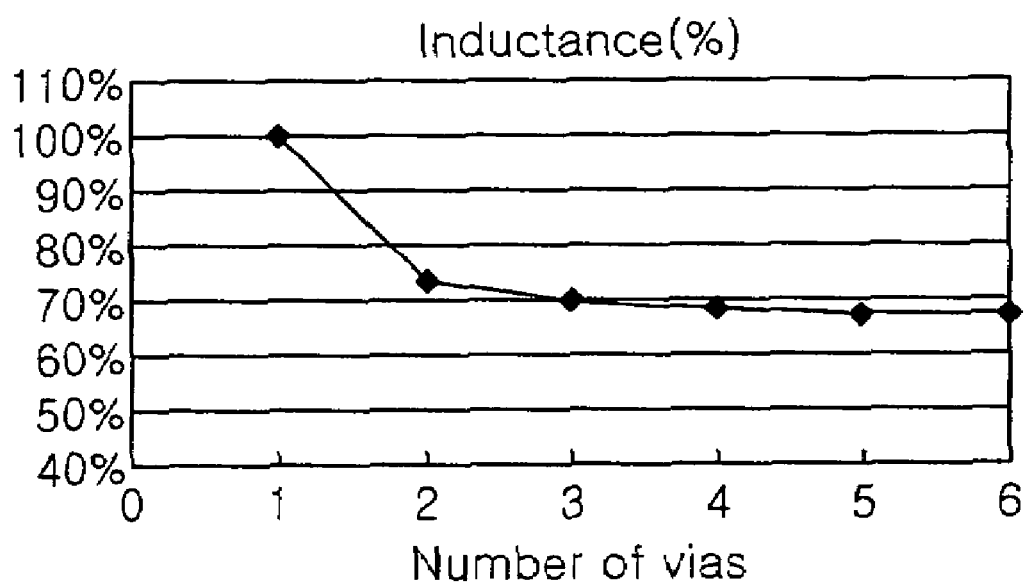
FIG. 7 is a graph illustrating a change in inductance according to the number of vias for each pad (the number of vias for each via column in a third pad)

FIG. 7 is a graph illustrating inductance changes according to the number of vias for each via column, (corresponding to the number of vias for each of the first and second pads and corresponding to the number of vias for each via column in the third pad area. In FIG. 7, when the number of vias for each pad (½ of the number of vias for third pad) is 1, the inductance ratio is set as 100%.

As illustrated in FIG. 7, as the number of vias for each via column increases, the entire inductance decreases. However, as shown in FIG. 7, when the number of vias for each via column is more than 2, though the number of vias for each via column increases, the effect of inductance reduction is small. Accordingly, in an aspect of the effect of inductance reduction, when two, three or more vias are used for each via column, the inductance can be sufficiently reduced without great increase of circuit board costs. According to the estimating simulation of inductances by which the graph shown in FIG. 7 is obtained, the inductance is further reduced by about 17.1 pH when two vias for each pad (for each via column) are used than when one via for each pad is used. When five vias for each pad (each via column) are used, the inductance is further reduced by only 4.1 pH than when two via holes for each pad are used.

The present inventors performed experiments to confirm a difference in inductance between a circuit board apparatus according to an exemplary embodiment of the present invention and a comparative circuit board apparatus. The circuit board apparatus according to an exemplary embodiment of the present invention has the 3-terminal vertical multilayer chip capacitor 100 and the mounting structure thereof shown in FIGS. 1 to 3 in which there are used five vias for each via column in each pad area as shown in FIG. 6.

Figure 8:
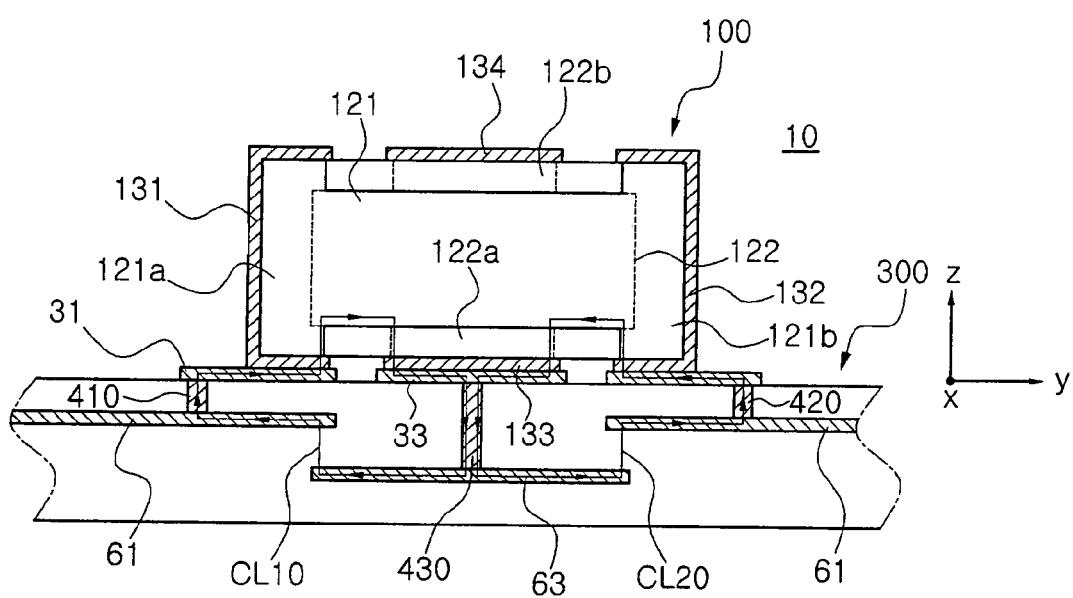
FIG. 8 is a cross-sectional view illustrating a comparative example of a circuit board apparatus, which is compared with the circuit board apparatus of FIG. 2.
Figure 9:
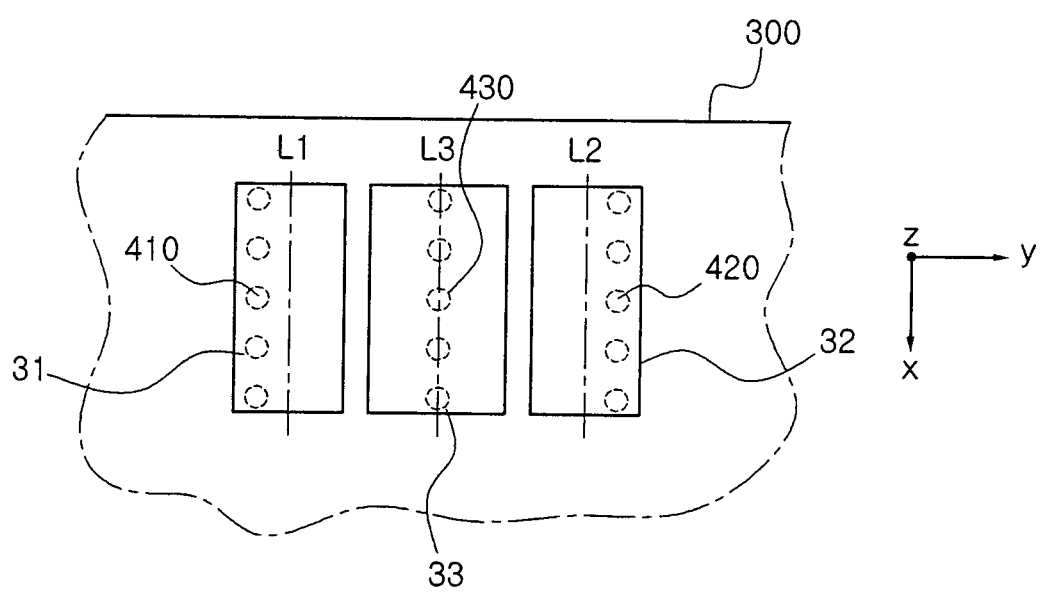
FIG. 9 is a top view illustrating a circuit board shown in FIG. 8.

On the other hand, the comparative circuit board apparatus 10 is as shown in FIGS. 8 and 9. In the comparative circuit board apparatus 10, similar to the circuit board apparatus according to an exemplary embodiment of the present invention, the capacitor 100 is used. However, positions of vias 410, 420, and 430 in a circuit board 300 are different from those of the exemplary embodiment. As illustrated in FIGS. 8 and 9, five first vias 410 connected to the first pad 31 of the circuit board 300 are disposed in an area far from the third pad 33 relative to the central line L1, and five second vias 420 connected to the second pad 32 are disposed in an area far from the third pad 33 relative to the central line L2. Five third vias 430 are arranged in the central line L3 of the third pad 33.

According to the comparative circuit board apparatus, as shown in FIG. 8, two current loops CL10 and CL20 are formed. The current loop CL10 passes through the first via 410, the first pad 31, the first external electrode 131, the first and second internal electrodes 121 and 122, the third external electrode 133, the third pad 33, and the third via 430. The current loop CL20 passes through the second via 420, the second pad 32, the second external electrode 132, the first and second internal electrodes 121 and 122, the third external electrode 133, the third pad 33, and the third via 430. The respective current loops CL10 and CL20 have relatively great size or areas. On the contrary, as shown in FIG. 2, in the circuit board apparatus according to an exemplary embodiment of the present invention, the current loops CL1 and CL2 with notably smaller size than the current loops CL10 and CL20 are formed. As a result of the experiments, the inductance of the comparative circuit board apparatus is higher by 11.3 pH than that of the circuit board apparatus according to an exemplary embodiment of the present invention. Accordingly, it can be seen that defining the positions of the vias in the circuit board apparatus according to an exemplary embodiment of the present invention is important to reduce the inductance.

Figure 10:
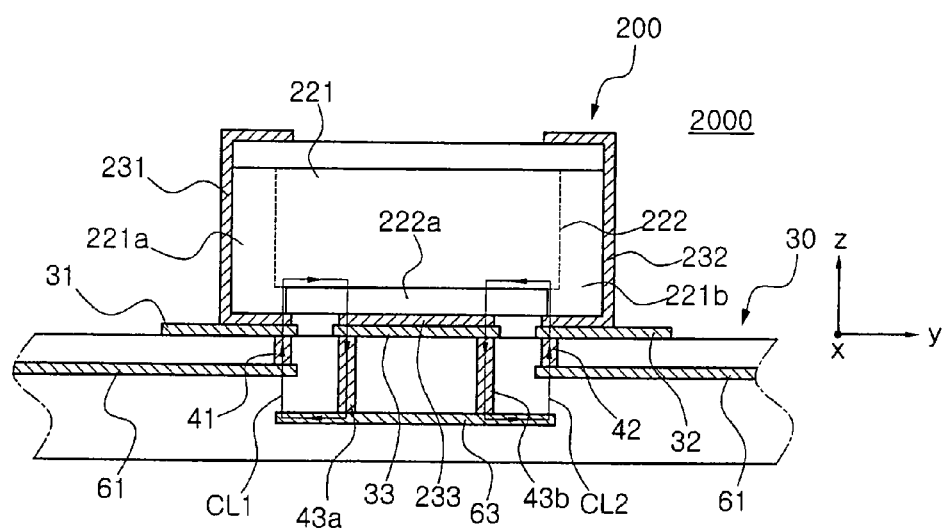
FIG. 10 is a cross-sectional view illustrating a circuit board apparatus according to another embodiment of the present invention.
Figure 11:
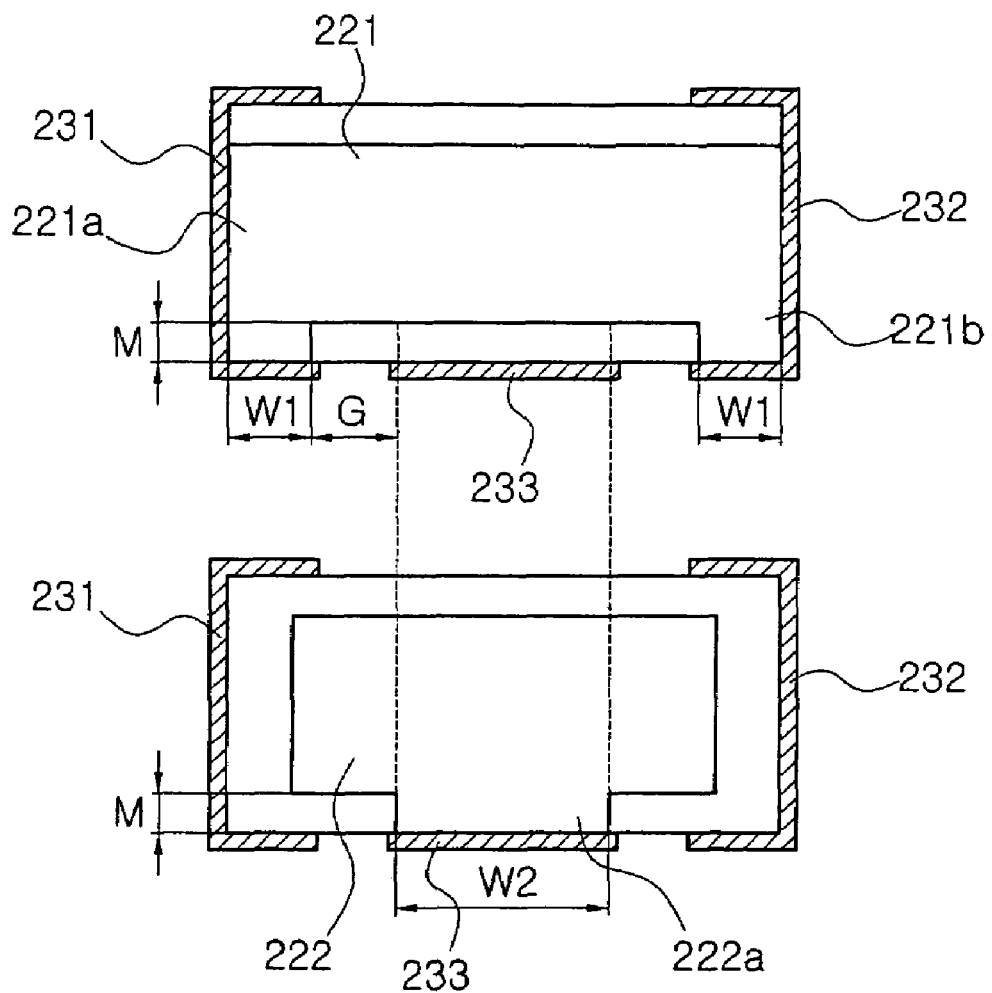
FIG. 11 is a cross-sectional view illustrating a structure of internal electrodes of a multilayer chip capacitor shown in FIG. 10.

FIG. 10 is a cross-sectional view illustrating a circuit board apparatus 2000 according to another embodiment of the present invention, and FIG. 11 is a cross-sectional view illustrating a structure of internal electrodes of a multilayer chip capacitor 200 shown in FIG. 10. In the capacitor 200, a fourth external electrode is omitted and the lead structures of the internal electrodes are different from those in FIG. 3. The capacitor 200 mounted on the circuit board 30 has internal and external structures where top and bottom are asymmetrical to each other. However, the structure of the circuit board 30, particularly, the structure of pads and vias of the circuit board 30, is identical to the structure of the circuit board described above with reference to FIGS. 2, 4, 5, 6 and 9.

Referring to FIG. 10, the circuit board apparatus 2000 includes the circuit board 30 and the 3-terminal vertical multilayer chip capacitor 200. First and second external electrodes 231 and 232 of one polarity are formed on both side surfaces of a capacitor body and partially extended onto a bottom surface thereof. A third external electrode 233 of the other polarity is disposed on the bottom surface between the first external electrode 231 and the second external electrode 232. Internal electrodes 221 and 222 of the capacitor 200 are vertically disposed on the bottom surface of the capacitor 200, that is, vertically disposed on a mounting area of the circuit board 30. As shown in FIG. 11, the first internal electrode 221 of the one polarity are connected to the first and second external electrode 231 and 232 through both leads 221a and 221b. The leads 221a and 221b are drawn to the respective side surfaces and the bottom surface and form a wide contact area between internal and external electrodes. The second internal electrode 222 of the other polarity is connected to the third external electrode 233 through a lead 222a.

The first and second external electrodes 231 and 232 of the capacitor 200 are connected to the first and second pads 31 and 32, respectively, and the third external electrode 233 is connected to the third pad 33. In FIGS. 10 and 11, the first via 41 connected to the first pad 31 and the second via 42 connected to the second pad 32 are disposed adjacent to the third pad 33. The third via 43a is disposed adjacent to the first via 41, and the third via 43b is disposed adjacent to the second via 42. Accordingly, as shown in FIG. 10, the current loops CL1 and CL2 having a reduced size can be formed.

Figure 12:
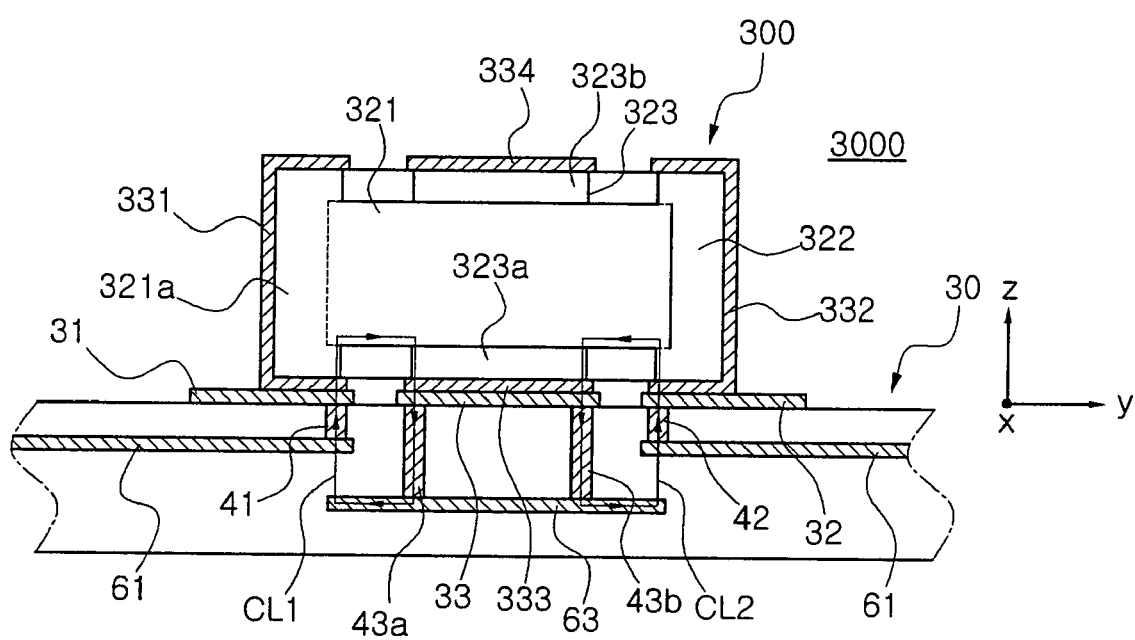
FIG. 12 is a cross-sectional view illustrating a circuit board apparatus according to still another embodiment of the present invention.
Figure 13:
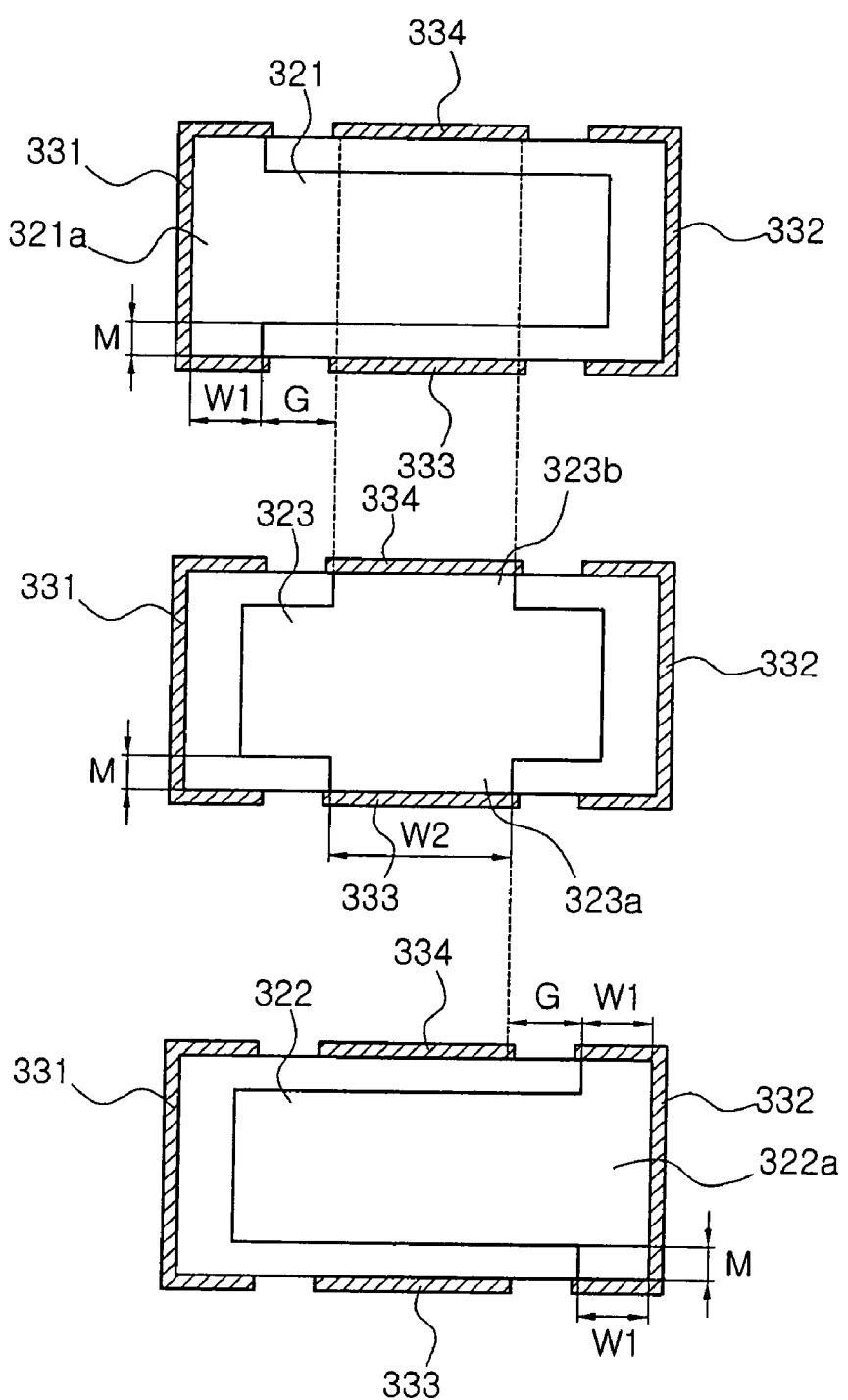
FIG. 13 is a cross-sectional view illustrating a structure of internal electrodes of a multilayer chip capacitor shown in FIG. 12.

FIG. 12 is a cross-sectional view illustrating a circuit board apparatus 3000 according to still another embodiment of the present invention, and FIG. 13 is a cross-sectional view illustrating a structure of internal electrodes of a multilayer chip capacitor 300 shown in FIG. 12. In FIGS. 12 and 13, instead of having an identical pattern, internal electrodes of one polarity have two different electrode patterns, respectively, and totally three internal electrode patterns 321, 322, and 323 are disposed in the capacitor 300.

Referring to FIG. 12, the capacitor 300 has the same external shape as that of the capacitor 100 shown in FIG. 1, and the circuit board 30 has the same structure as that of the circuit board shown in FIG. 2. First and second external electrodes 331 and 332 of one polarity are formed on both side surfaces of a capacitor body and partially extended to a bottom surface thereof. A third external electrode 333 of another polarity is disposed on the bottom surface between the first and second external electrodes 331 and 332. In addition, a fourth external electrode 334 may be disposed on a top surface. The internal and external structures of the capacitor 300 have up-down symmetry.

The internal electrodes 321, 322, and 323 of the capacitor 300 are vertically disposed on the bottom surface thereof. Referring to FIGS. 12 and 13, the first internal electrode pattern 321 and the second internal electrode pattern 322 of a first polarity are alternately disposed. The third internal electrode pattern 323 of a second polarity is disposed between the internal electrode patterns 321 and 322. The internal electrode patterns 321, 322, and 323 are repeatedly, alternately disposed in an order of 321, 323, 322, 323, 321, 323, 322, 323, . . . . The first-polarity internal electrodes 321 and 322 have T-shaped electrode patterns, and the second-polarity internal electrode 323 has a +-shaped electrode pattern.

As shown in FIG. 13, the first internal electrode pattern 321 of the first polarity in the T-shape is connected to the first external electrode 331 through a lead 321a, and the second internal electrode pattern 322 of the first polarity in the T-shape is connected to the second external electrode 332 through a lead 322a. The third internal electrode pattern 323 of the second polarity in the +-shape is connected to the third and fourth external electrodes 333 and 334 through leads 323a and 323b. The first and second internal electrode patterns 321 and 322 have wide contact areas between internal and external electrodes through the leads 321a and 322a drawn to side surfaces and top and bottom surfaces. Since the above-mentioned position condition of the vias 41, 42, 43a and 43b is also satisfied in FIGS. 12 and 13, current loops CL1 and CL2 reduced as shown in FIG. 12 can be formed.

Figure 14:
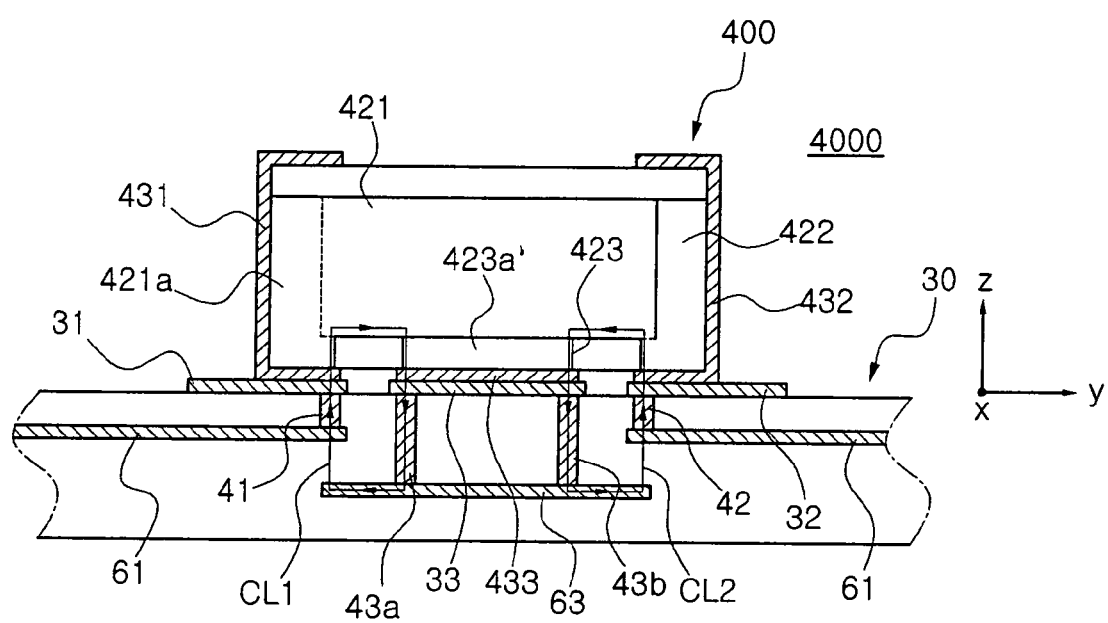
FIG. 14 is a cross-sectional view illustrating a circuit board apparatus according to yet another embodiment of the present invention.
Figure 15:
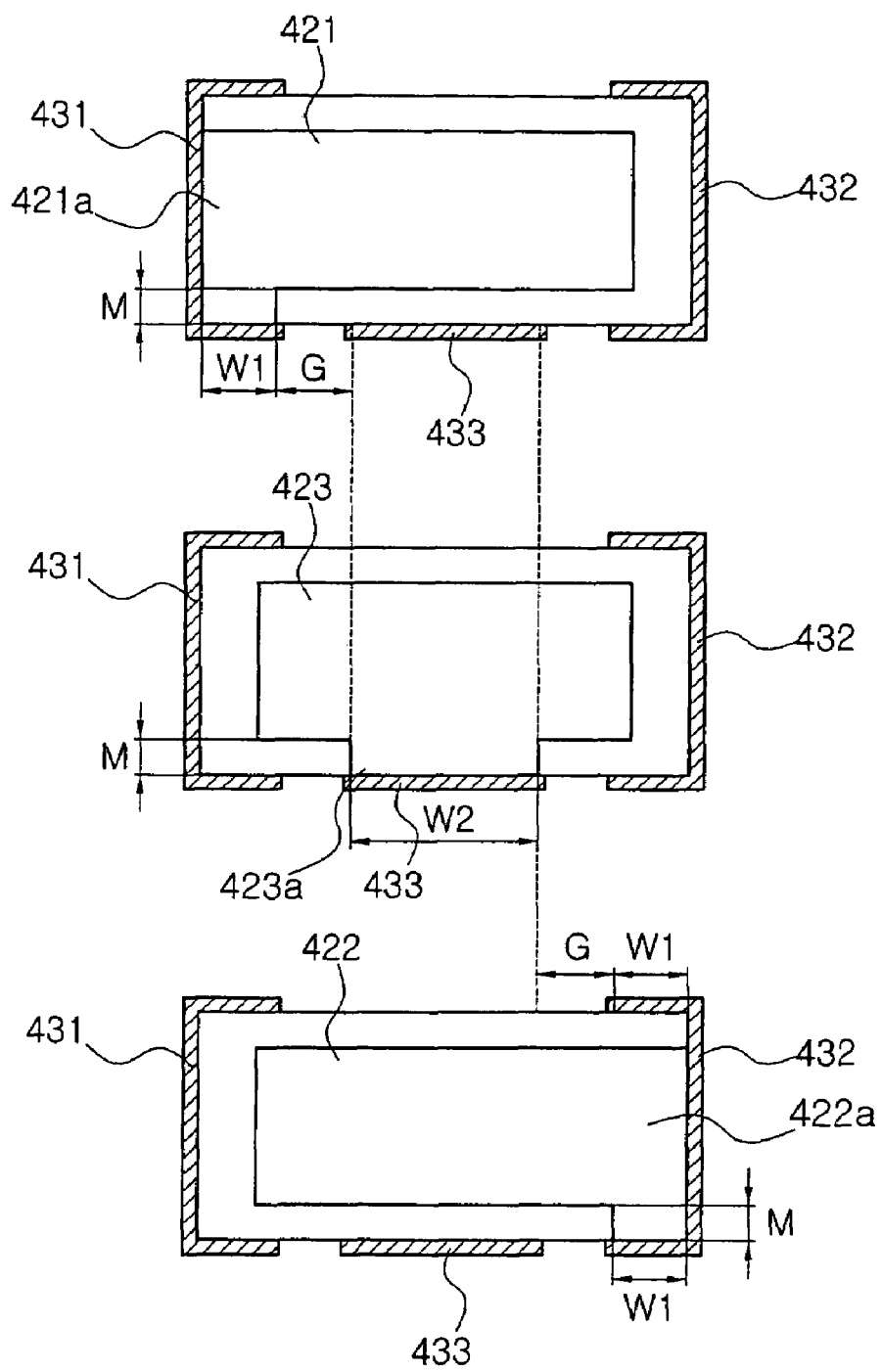
FIG. 15 is a cross-sectional view illustrating a structure of internal electrodes of a multilayer chip capacitor shown in FIG. 14.

FIG. 14 is a cross-sectional view illustrating a circuit board apparatus 4000 according to yet another embodiment of the present invention, and FIG. 15 is a cross-sectional view illustrating a structure of internal electrodes of a multilayer chip capacitor 400 shown in FIG. 14. In the circuit board apparatus 4000, a fourth external electrode is omitted and the capacitor 400 has internal and external structures where top and bottom are asymmetrical to each other. The capacitor 400 has the same external structure as that of the capacitor 200 of FIG. 10, and a circuit board structure thereof is the same as those described above.

First and second external electrodes 431 and 432 of a first polarity are formed on both side surfaces of a capacitor body and partially extended onto a bottom surface thereof. A third external electrode 433 of a second polarity is disposed on the bottom surface between the first and second external electrodes 431 and 432. Internal electrodes 421, 422, and 423 of the capacitor 400 are vertically disposed on the bottom surface of the capacitor 400. Referring to FIGS. 14 and 15, the first internal electrode pattern 421 of the first polarity and the second internal electrode pattern 422 of the first polarity are alternately disposed. The third internal electrode pattern 423 of the second polarity is disposed between the internal electrode patterns 421 and 422 of the first polarity. The internal electrode patterns 421, 422, and 423 are repeatedly, alternately disposed in an order of 421, 423, 422, 423, 421, 423, 422, and 423, . . . .

As shown in FIG. 15, the first internal electrode pattern 421 having the first polarity is connected to the first external electrode 431 through a lead 421a, and the second internal electrode pattern 422 having the first polarity is connected to the second external electrode 433 through a lead 423a. The first and second internal electrode patterns 421 and 422 have wide contact areas between internal and external electrodes, through the leads 421a and 422a drawn to side surfaces and top and bottom surfaces. The above-mentioned position condition of vias 41, 42, 43a and 43b is satisfied in the circuit board apparatus 4000 shown in FIGS. 14 and 15, thereby forming current loops CL1 and CL2 having reduced sizes as shown in FIG. 14.

While the present invention has been shown and described in connection with the exemplary embodiments, it will be apparent to those skilled in the art that modifications and variations can be made without departing from the spirit and scope of the invention as defined by the appended claims.

What is claimed is:

1. A circuit board comprising:
   a substrate having a mounting area for mounting a vertical multilayer chip capacitor having first and second external electrodes of a first polarity and a third external electrode of a second polarity;
   first to third pads arranged on the mounting area of the substrate, the first and second pads having the first polarity and disposed separately from each other on the mounting area to be connected to the first and second external electrodes, respectively, the third pad having the second polarity and disposed between the first and second pads to be connected to the third external electrode;

at least one first via formed in the substrate and connected to the first pad;

at least one second via formed in the substrate and connected to the second pad; and a plurality of third vias formed in the substrate and connected to the third pad, wherein the first via is disposed adjacent to the third pad relative to a central line of the first pad, the second via is disposed adjacent to the third pad relative to a central line of the second pad, one or more of the third vias are disposed adjacent to the first via relative to a central line of the third pad, and the rest of the third vias are disposed adjacent to the second via relative to the central line of the third pad.

2. The circuit board of claim 1, wherein one of the first via, one of the second via and two of the third vias are disposed in the circuit board.

3. The circuit board of claim 2, wherein the first to third vias are aligned in a direction identical to an arrangement direction of the first to third pads.

4. The circuit board of claim 1, wherein a plurality of the first vias and a plurality of the second vias are disposed in the circuit board.

5. The circuit board of claim 4, wherein, two of the first vias, two of the second vias, and four of the third vias are disposed in the circuit board.

6. The circuit board of claim 4, wherein the plurality of the first vias form at least one first via column in a longitudinal direction of the first pad, the plurality of the second vias form at least one second via column in a longitudinal direction of the second pad, the plurality of the third vias form a plurality of third via columns in a longitudinal direction of the third pad, each of the first to third via columns comprising two or more vias, and one or more of the plurality of third via columns are adjacent to the first via column and the rest of the plurality of third via columns are adjacent to the second via column.

7. The circuit board of claim 6, wherein each of the via columns comprises two vias.

8. A circuit board apparatus comprising:

a circuit board; and a vertical multilayer chip capacitor mounted on the circuit board and having first and second external electrodes of a first polarity and a third external electrode of a second polarity, wherein the circuit board comprises:

a substrate having a mounting area for mounting the vertical multilayer chip capacitor;

first to third pads arranged on the mounting area of the substrate, the first and second pads having the first polarity and disposed separately from each other on the mounting area to be connected to the first and second external electrodes, respectively, and the third pad having the second polarity and disposed between the first and second pads to be connected to the third external electrode;

at least one first via formed in the substrate and connected to the first pad;

at least one second via formed in the substrate and connected to the second pad; and a plurality of third vias formed in the substrate and connected to the third pad, wherein the first via is disposed adjacent to the third pad relative to a central line of the first pad, the second via is disposed adjacent to the third pad relative to a central line of the second pad, one or more of the third vias are disposed adjacent to the first via relative to a central line of the third pad, and the rest of the third vias are disposed adjacent to the second via relative to the central line of the third pad, and the vertical multilayer chip capacitor comprises:

a capacitor body formed by laminating a plurality of dielectric layers, the capacitor body having first and second side surfaces facing each other and a bottom surface; and a plurality of first-polarity and second-polarity internal electrodes alternately disposed to face each other in the capacitor body, interposing the respective dielectric layers therebetween, disposed vertical to the bottom surface of the capacitor body and drawn to the bottom surface, wherein the first and second external electrodes are formed on the first and second side surfaces, respectively, partially extended onto the bottom surface and electrically connected to the first-polarity internal electrode, the third external electrode is formed on the bottom surface between the first and second external electrodes and electrically connected to the second-polarity internal electrodes, and two current loops are generated by currents flowing from the first and second external electrodes to the third external electrode.

9. The apparatus of claim 8, wherein each of the first-polarity internal electrodes is drawn to the bottom surface and at least one side surface of the first and second side surfaces of the capacitor body.

10. The apparatus of claim 8, wherein a width of the third external electrode is greater than a width of a portion of the first external electrode extended onto the bottom surface, and a width of a portion of the second external electrode extended onto the bottom surface.

11. The apparatus of claim 8, wherein each of the first-polarity internal electrodes has a first internal electrode pattern connected to both the first and second external electrodes, and each of the second polarity internal electrodes has a second internal electrode pattern connected to the third external electrode.

12. The apparatus of claim 8, wherein the first-polarity internal electrodes have a first internal electrode pattern connected to only the first external electrode and a second internal electrode pattern connected to only the second external electrode, the first and second internal electrode patterns alternately disposed in a lamination direction, and each of the second-polarity internal electrodes has a third internal electrode pattern connected to the third external electrode.

13. The apparatus of claim 8, wherein the multilayer chip capacitor further comprises a fourth external electrode of the second polarity formed on a top surface of the capacitor body between the first external electrode and the second external electrode.

14. The apparatus of claim 13, wherein internal and external structures of the multilayer chip capacitor have up-down symmetry.

15. The apparatus of claim 13, wherein each of the first-polarity internal electrodes has an H-shaped electrode pattern to be connected to both the first and second external electrodes, and each of the second-polarity internal electrodes has a +-shaped electrode pattern to be connected to both the third and fourth external electrodes.

16. The apparatus of claim 13, wherein the first-polarity internal electrodes have a first T-shaped electrode pattern connected to the first external electrode and a second T-shaped electrode pattern connected to the second external electrode, the first and second T-shaped electrode patterns being alternately disposed in a lamination direction, and each of the second-polarity internal electrodes has a +-shaped electrode pattern.

17. The apparatus of claim 8, wherein one of the first via, one of the second via and two of the third vias are disposed in the circuit board.

18. The apparatus of claim 17, wherein the first to third vias are aligned in a direction identical to an arrangement direction of the first to third pads.

19. The apparatus of claim 8, wherein a plurality of the first vias and a plurality of the second vias are disposed in the circuit board.

20. The apparatus of claim 19, wherein, two of the first vias, two of the second vias and four of the third vias are disposed in the circuit board.

21. The apparatus of claim 19, wherein the plurality of the first vias form at least one first via column in a longitudinal direction of the first pad, the plurality of the second vias form at least one second via column in a longitudinal direction of the second pad, and the plurality of the third vias form a plurality of third via columns in a longitudinal direction of the third pad, each of the first to third via columns comprising two or more vias, one or more of the plurality of third via columns are adjacent to the first via column and the rest of the plurality of third via columns are adjacent to the second via column.

22. The apparatus of claim 21, wherein each of the via columns comprises two vias.

* * * * *